(12) United States Patent (10) Patent No.: US 8,850,291 B2
Kang et al. (45) Date of Patent: Sep. 30, 2014

(54) DATA INPUT AND OUTPUT METHOD OF NAND FLASH MEMORY AND EMBEDDED SYSTEM USING THE SAME

(75) Inventors: Dong Wook Kang, Daejeon (KR); Chae Deok Lim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 376 days.

(21) Appl. No.: 12/984,984

(22) Filed: Jan. 5, 2011

(65) Prior Publication Data

US 2012/0096333 A1 Apr. 19, 2012

(30) Foreign Application Priority Data

Oct. 13, 2010 (KR) .......................... 10-2010-0099612

(51) Int. Cl.
*G11C 29/00* (2006.01)
*H03M 13/00* (2006.01)

(52) U.S. Cl.
USPC .......................................... 714/773; 714/779

(58) Field of Classification Search
USPC ................................................ 714/773, 779
See application file for complete search history.

(56) References Cited

U.S. PATENT DOCUMENTS

| 4,047,151 | A | * | 9/1977 | Rydbeck et al. | ............... | 714/774 |
| 5,828,677 | A | * | 10/1998 | Sayeed et al. | ................. | 714/774 |
| 6,754,018 | B2 | * | 6/2004 | Takahashi | ........................ | 360/53 |
| 6,904,492 | B2 | * | 6/2005 | Hogan | ........................... | 711/102 |
| 7,511,646 | B2 | * | 3/2009 | Cornwell et al. | ............. | 341/126 |
| 8,006,165 | B2 | * | 8/2011 | Yoshida | ........................ | 714/763 |
| 2002/0008928 | A1 | * | 1/2002 | Takahashi | ........................ | 360/53 |
| 2006/0143368 | A1 | * | 6/2006 | Lasser et al. | ................... | 711/103 |
| 2007/0074093 | A1 | * | 3/2007 | Lasser | ........................... | 714/763 |
| 2007/0262890 | A1 | * | 11/2007 | Cornwell et al. | ............... | 341/51 |
| 2008/0016430 | A1 | * | 1/2008 | Yoshida | ........................ | 714/764 |
| 2009/0044077 | A1 | | 2/2009 | Choi et al. | | |
| 2010/0023845 | A1 | * | 1/2010 | Cheng et al. | .................. | 714/790 |

FOREIGN PATENT DOCUMENTS

| KR | 10-0246184 B1 | 12/1999 |
| KR | 10-2009-0014828 | 2/2009 |
| KR | 1020090105760 | 10/2009 |

* cited by examiner

*Primary Examiner* — Joseph D Torres
(74) *Attorney, Agent, or Firm* — Nelson Mullins Riley & Scarborough LLP; Anthony A. Laurentano, Esq.; Dipti Ramnarain, Esq.

(57) ABSTRACT

A data input method of a NAND flash memory includes: determining whether a size of a writing-requested data is less than a reference value; calculating an error correction code (ECC) for the data using a software ECC method when the data size is less than the reference value; and writing the data and the ECC to a data region of the NAND flash memory. A data output method of the NAND flash memory includes: determining whether a size of a reading-requested data is less than a reference value; reading the data and an error correction code (ECC) from the NAND flash memory; calculating an ECC for the read data using a software ECC method when the data size is less than the reference value; and performing an error detection and correction by comparing the calculated ECC and the read ECC.

7 Claims, 3 Drawing Sheets

DATA INPUT AND OUTPUT METHOD OF NAND FLASH MEMORY AND EMBEDDED SYSTEM USING THE SAME

CROSS-REFERENCE(S) TO RELATED APPLICATION(S)

The present invention claims priority of Korean Patent Application No. 10-2010-0099612, filed on Oct. 13, 2010, which is incorporated herein by reference.

FIELD OF THE INVENTION

The present invention relates to a NAND flash memory; and, more particularly, to a data input and output method of the NAND flash memory which enables error correction, without reading all data region of the NAND flash memory, regarding data having a fixed size and a smaller size than that of the data region, and an embedded system using the same.

BACKGROUND OF THE INVENTION

NAND flash memory is composed of a number of blocks, each of which is made up of a number of pages. One page is divided into a data region and a spare region.

Reading and writing operations for NAND flash can be performed on a page-by-page basis, but overwriting and erasing operation are performed on a block-by-block basis.

A conventional NAND flash memory uses a hardware-based error correction code (ECC) calculation method for correcting errors in data inputted thereto or outputted therefrom. The hardware-based ECC calculation method provides a higher operation speed than a software-based method. However, since an error correction code is computed after all the data in the data region is read in the hardware-based ECC calculation method, it is disadvantageous that all the data has to be read even in case that small amount of data is stored.

SUMMARY OF THE INVENTION

In view of the above, the present invention provides a data input and output method of the NAND flash memory which can improve data reading and writing speed by performing an error correction using a software ECC method if a small amount of data is read or written and performing an error correction using a hardware ECC method if not, and an embedded system using the same.

In accordance with a first aspect of the present invention, there is provided a data input method of a NAND flash memory, including:

receiving a writing request of data into the NAND flash memory;

determining whether a size of the data is less than a reference value;

calculating an error correction code (ECC) for the data using a software ECC method when the data size is less than the reference value; and writing the data and the ECC to a data region of the NAND flash memory.

In accordance with a second aspect of the present invention, there is provided an embedded system, including:

a NAND flash memory for storing data;

an interface for transferring data to be inputted to the NAND flash memory;

a software ECC generation unit for calculating an ECC for the data using a software ECC method;

a hardware ECC generation unit for calculating an ECC for the data using a hardware ECC method; and a writing control unit for selectively operating the software ECC generation unit or the hardware ECC generation unit depending on a size of an inputted data.

In accordance with a third aspect of the present invention, there is provided a data output method of a NAND flash memory, including:

receiving a reading request of data stored in the NAND flash memory;

determining whether a size of the data is less than a reference value;

reading the data and an error correction code (ECC) from the NAND flash memory;

calculating an ECC for the read data using a software ECC method when the data size is less than the reference value; and performing an error detection and correction by comparing the calculated ECC and the read ECC.

In accordance with a fourth aspect of the present invention, there is provided an embedded system, including:

a NAND flash memory storing data and an error correction code (ECC) for the data;

an interface for transferring data outputted from the NAND flash memory;

a software ECC generation unit for calculating an ECC for the data using a software ECC method;

a hardware ECC generation unit for calculating an ECC for the data using a hardware ECC method;

a code control unit for selectively operating the software ECC generation unit or the hardware ECC generation unit depending on a size of a requested data; and an error correction unit for detecting and correcting an error by comparing the ECC stored in the NAND flash memory and an ECC generated by the software ECC generation unit or the hardware ECC generation unit.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Hereinafter, embodiments of the present invention will be described with reference to the accompanying drawings which form a part hereof.

Figure 1:
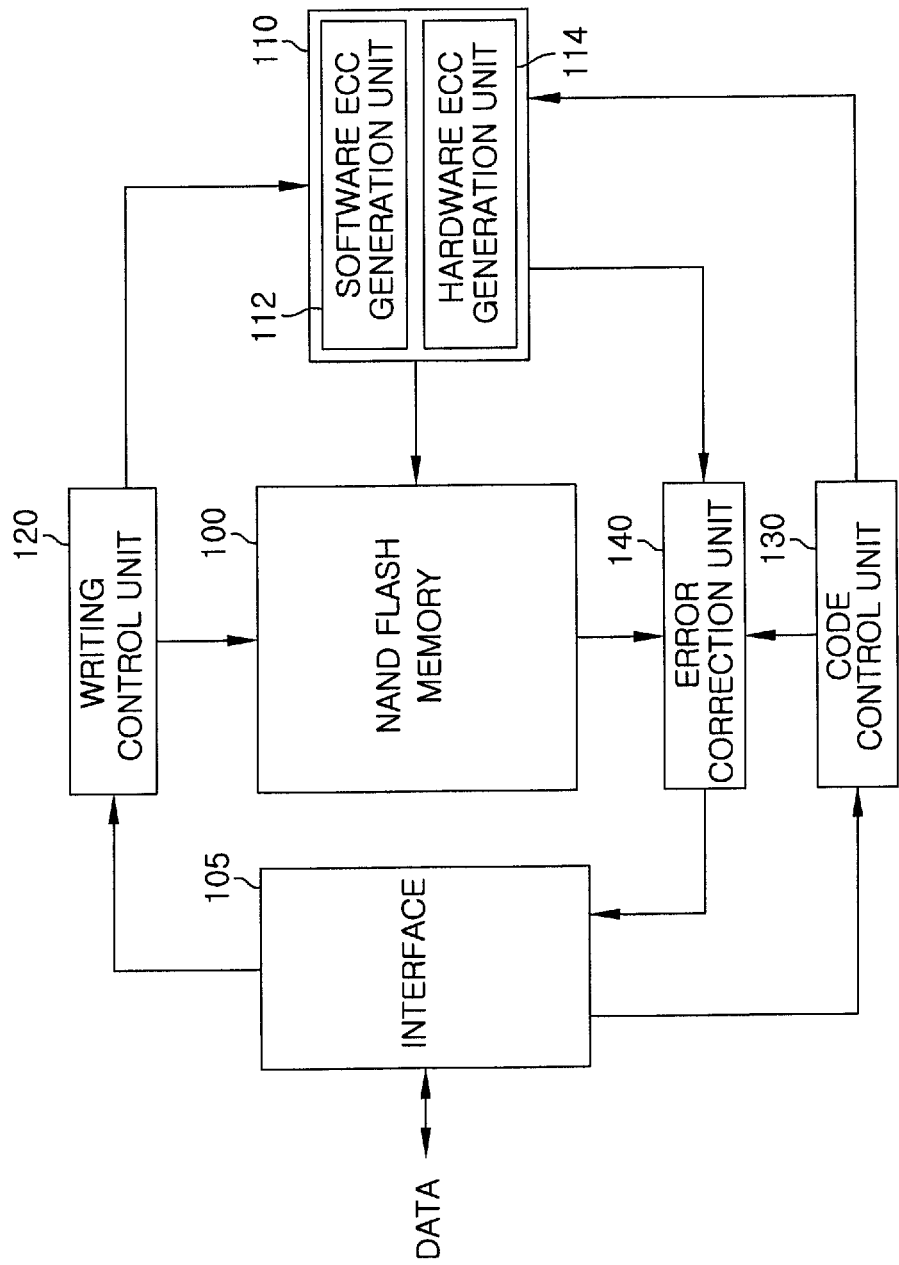
FIG. 1 is a block diagram showing a data input/output (I/O) device including a NAND flash memory in an embedded system in accordance with an embodiment of the present invention.

FIG. 1 is a block diagram showing a data input/output (I/O) device in an embedded system including a NAND flash memory in accordance with an embodiment of the present invention. The data I/O device includes a NAND flash memory 100, an interface 105, an error correction code (ECC) generation unit 110, a writing control unit 120, a code control unit 130, and an error correction unit 140.

In the NAND flash memory 100, each of pages is divided into a data region where in general data is stored and a spare region where in general an ECC is stored. Reading and writing operations of the NAND flash memory 100 is performed on a page-by-page basis.

The interface 105 is connected to the NAND flash memory 100 and delivers data inputs and outputs. That is, data are written into the NAND flash memory 100 through the interface 105 or read from the NAND flash memory 100 through the interface 105.

The ECC generation unit 110 includes a software ECC generation unit 112 for generating an ECC using a software ECC method, and a hardware ECC generation unit 114 for generating an ECC using a hardware ECC method.

The writing control unit 120 controls the ECC generation unit 110 depending on the size of data inputted through the interface 105, i.e., the size of data to be written. In detail, the software ECC generation unit 112 is operated if the size of the inputted data is less than a preset value, and the hardware ECC generation unit 114 is operated if the size of the inputted data is equal or larger than the preset value.

Although the ECC generation unit 110 exists separately from the interface 105 in this embodiment, it is appreciated to those skilled in the art that the ECC generation unit 110 may be incorporated within the interface 105.

The code control unit 130 controls the ECC generation unit 110 in regard to data reading. In detail, when data reading is requested, the code control unit 130 reads the requested data from the NAND flash memory 100 via the interface 105. Then, the code control unit 130 controls the software ECC generation unit 112 to generate an ECC if the size of the read data is less than a preset reference value, and controls the hardware ECC generation unit 114 to generate an ECC if the size of the read data is equal or larger than the preset reference value. The generated ECC is delivered to the error correction unit 140.

The error correction unit 140 reads an ECC for the requested data which has been stored in the data region or the spare region of the NAND flash memory 100. Further, the error correction unit 140 compares the read ECC with the generated ECC received from the ECC generation unit 110, to thereby detect and correct an error.

An operating process of the data I/O device will be described with reference to FIGS. 2 and 3.

Figure 2:
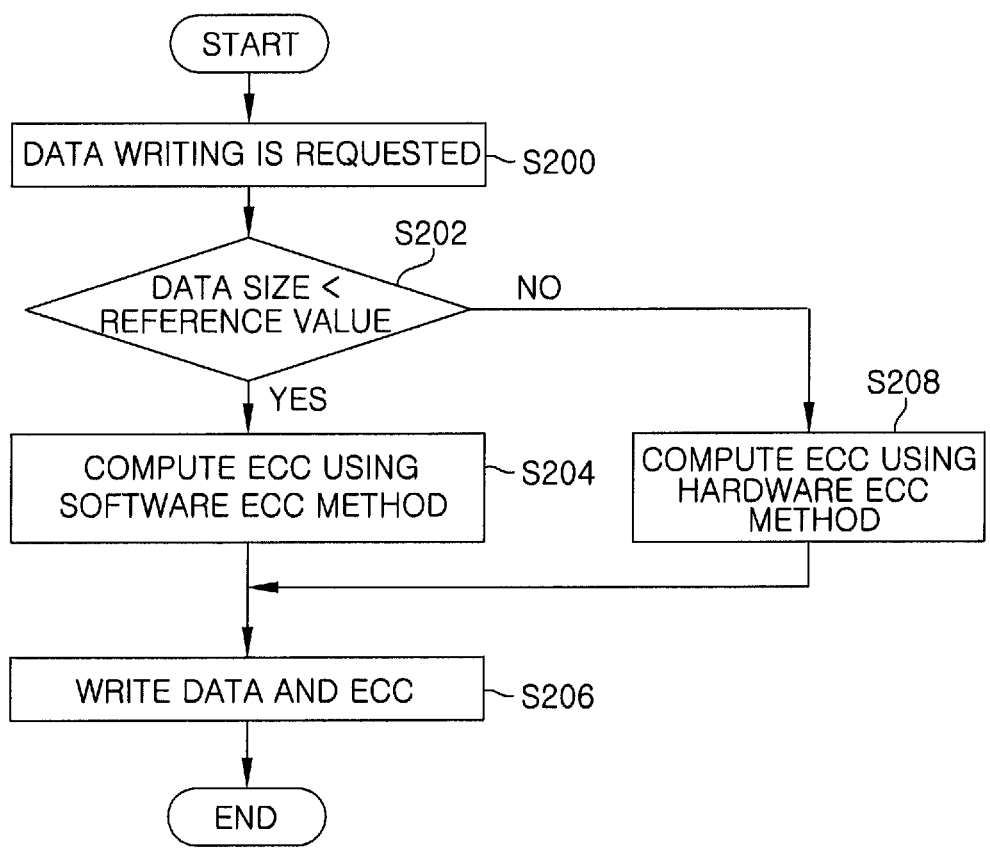
FIG. 2 shows a flowchart depicting a process of writing data to the NAND flash memory in accordance with the embodiment of the present invention.

FIG. 2 shows a flowchart depicting a process of writing data to the NAND flash memory in accordance with the embodiment of the present invention.

As shown in FIG. 2, when data writing is requested in step S200, the writing control unit 120 determines whether the size of the writing-requested data is less than a preset reference value in step S202. Herein, the requested data to be written has a fixed size, and the reference value is set to be the same or less than the size of the data region where data is written.

If it is determined in step S202 that the data size is less than the preset reference value, the writing control unit 120 operates the software ECC generation unit 112 to generate an ECC in step S204. In other words, the software ECC generation unit 112 computes the ECC for the requested data using the software ECC method. The requested data and the ECC are written to the data region of the NAND flash memory 100 in step S206.

If it is, however, determined in step S202 that the data size is equal or larger than the preset reference value, the writing control unit 120 operates the hardware ECC generation unit 114 to generate an ECC in step S208. Thereafter, the process goes to the step S206 to store the requested data and the ECC in the NAND flash memory 100. At this time, the ECC is stored not in the data region but in the spare region.

In accordance with the embodiment of the present invention, when writing-requested data is data of which size is fixed and less than the preset reference value, an ECC for the data is generated using a software ECC method and is written along with the data. Thus, a writing performance is improved with regard to data having smaller size than a page size.

Figure 3:
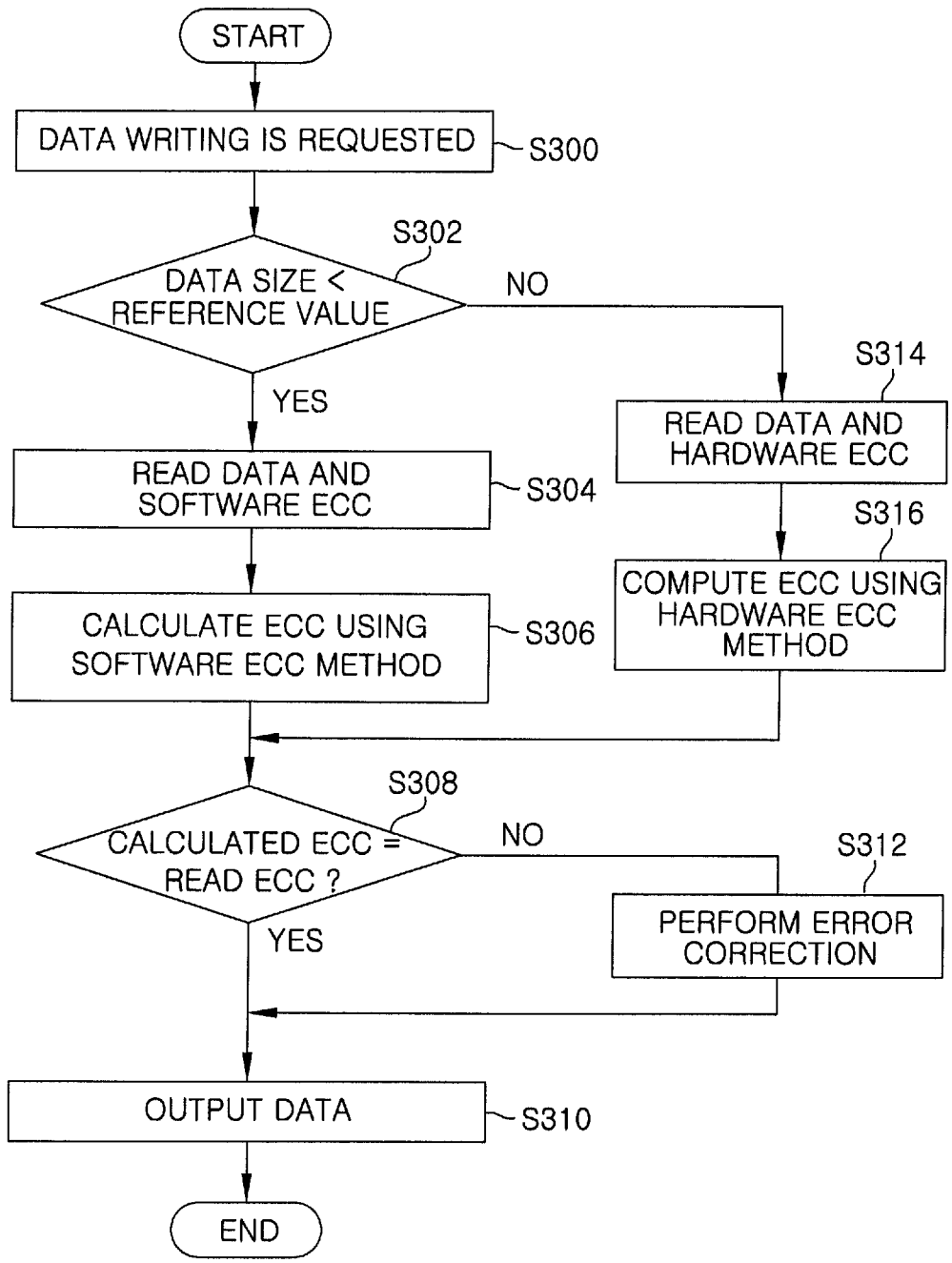
FIG. 3 shows a flowchart depicting a process of reading data from the NAND flash memory in accordance with the embodiment of the present invention.

FIG. 3 shows a flowchart depicting a process of reading data from the NAND flash memory in accordance with the embodiment of the present invention.

Referring to FIG. 3, when the data reading is requested in step S300, the code control unit 130 determines whether the size of the requested data is less than a preset reference value in step S302. Herein, the requested data has a fixed size, and the reference value is set to be the same or less than the size of the data region where data is written.

If it is determined in step S302 that the size of the requested data is less than the preset reference value, the requested data and a corresponding ECC are read from the data region of the NAND flash memory 100 in step S304. At this point, the requested data is read by the code control unit 130 and delivered to the error correction unit 140 for error correction, and the ECC, which is a software ECC, is read by the error correction unit 140.

Next, the code control unit 130 operates the software ECC generation unit 112 to generate an ECC for the read data in step S306. That is, the software ECC generation unit 112 computes the ECC for the read data using the software ECC method. The computed ECC is delivered to the error correction unit 140. Also, the read data is delivered from the code control unit 130 to the error correction unit 140.

The error correction unit 140 compares the read ECC to the computed ECC received from the software ECC generation unit 112 in step S308.

If the read ECC is equivalent to the computed ECC in step S308, the error correction unit 140 outputs the read data received from the code control unit 130 through the interface 105 in step S310. If the read ECC is not equivalent to the computed ECC in step S308, the error correction unit 140 detects and corrects an error regarding the read data in step S312 and outputs error-corrected data in step S310.

If it is determined in step S302 that the size of the requested data is equal or larger than the preset reference value, the requested data is read from the data region of the NAND flash memory 100 and a corresponding ECC is read from the spare region of the NAND flash memory 100 in step S314. Here, the requested data is read by the code control unit 130 and delivered to the error correction unit 140 for error correction, and the ECC, which is a hardware ECC, is read by the error correction unit 140.

Thereafter, the code control unit 130 operates the hardware ECC generation unit 114 to generate an ECC for the read data in step S316. That is, the hardware ECC generation unit 114 computes the ECC for the read data using the hardware ECC method. The computed ECC is delivered to the error correction unit 140.

Then, the process goes to the step S308 where the error correction unit 140 compares the read ECC to the computed ECC received from the hardware ECC generation unit 114. According to the comparison result, the process goes to the step S310 or the step S312.

In accordance with the embodiment of the present invention, when the size of data requested to be read is fixed and less than a preset reference value, an ECC for the data can be read without reading all the data region of a page. Further, the read ECC is compared to an ECC generated using the software ECC method to thereby detect and correct an error, and thus the performance can be improved with regard to the error correction.

For the unsorted block images (UBI)/UBI file system (UBIFS) NAND flash file system, a volume ID (VID) header and an erase counter (EC) header have to be read during a mount process. These VID and EC headers have 64 bytes, which are very small size compared to a page having several hundred or thousand bytes. Applying the embodiment of the present invention to the UBI/UBIFS NAND flash file system remarkably reduces the amount of data to be read, thereby improving the mount speed.

While the invention has been shown and described with respect to the embodiments, it will be understood by those skilled in the art that various changes and modification may be made without departing from the scope of the invention as defined in the following claims.

What is claimed is:

1. A data processing method of a NAND flash memory, comprising:
   receiving a request for processing data with respect to the NAND flash memory, wherein the NAND flash memory comprises a plurality of pages, and each of the pages is divided into a data region for storing the data and a spare region;
   determining whether a size of the data is less than a reference value; and
   calculating an error code (ECC) for the data,
   processing the data and the ECC with respect to the data region,
   wherein said calculating the ECC is performed by selectively using a software ECC method or a hardware ECC method depending on size of the data such that the software ECC method is used when the size of the data is less than the reference value and the hardware ECC method is used when the size of the data is equal to or greater than the reference value,
   wherein the received request is a writing request of the data into the NAND flash memory,
   wherein said processing the data and the ECC includes writing the data and the ECC to the data region of the NAND flash memory, and
   wherein the reference value is set to be the same or less than a size of the data region of a page.

2. The data processing method of claim 1, wherein said processing the data and the ECC further includes:
   calculating the ECC for the data using a hardware ECC method when the data size is equal or larger than the reference value; and
   writing the data into the data region and the ECC into a spare region of the NAND flash memory.

3. The data processing method claim 1, wherein the received request is a reading request of the data, the data being stored in the NAND flash memory, and
   wherein said processing the data and the ECC includes:
      reading the data and the ECC from the NAND flash memory; and
      performing an error detection and correction by comparing the calculated ECC and the read ECC.

4. The data processing method of claim 3, wherein said processing the data and the ECC further includes:
   calculating the ECC for the read data using a hardware ECC method when the data size is equal or larger than the reference value.

5. The data processing method of claim 4, wherein the reference value is set to be the same or less than a size of the data region of the NAND flash memory.

6. The data processing method of claim 3, wherein the reference value is set to be the same or less than a size of the data region of the NAND flash memory.

7. The reference value of claim 1, wherein the reference value is set to a reference value size to be the same or less than the size of the data region.

* * * * *